United States Patent
Maki

(10) Patent No.: US 9,350,368 B2
(45) Date of Patent: May 24, 2016

(54) ATOMIC CELL, ATOMIC RESONANCE TRANSITION DEVICE, ATOMIC OSCILLATOR, ELECTRONIC APPARATUS, AND MOVING OBJECT

(71) Applicant: Seiko Epson Corporation, Tokyo (JP)

(72) Inventor: Yoshiyuki Maki, Suwa (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 14/494,915

(22) Filed: Sep. 24, 2014

(65) Prior Publication Data

US 2015/0084707 A1    Mar. 26, 2015

(30) Foreign Application Priority Data

Sep. 26, 2013    (JP) ................... 2013-200579

(51) Int. Cl.
*G04F 5/14*    (2006.01)
*H03L 7/26*    (2006.01)

(52) U.S. Cl.
CPC .. H03L 7/26 (2013.01); G04F 5/14 (2013.01); G04F 5/145 (2013.01)

(58) Field of Classification Search
CPC ............ G04F 5/14; G04F 5/145; H03L 7/26; H01S 1/06
USPC ............................................. 331/94.1, 3
See application file for complete search history.

(56) References Cited

U.S. PATENT DOCUMENTS

| | | | |
|---|---|---|---|
| 7,400,207 B2 * | 7/2008 | Lipp et al. | 331/94.1 |
| 7,999,626 B2 * | 8/2011 | Chindo et al. | 331/94.1 |
| 2012/0235754 A1 * | 9/2012 | Chindo | G04F 5/145 331/94.1 |

FOREIGN PATENT DOCUMENTS

| | | |
|---|---|---|
| JP | 2000-332338 A | 11/2000 |
| JP | 2007-096702 A | 4/2007 |
| JP | 2010-205875 A | 9/2010 |

* cited by examiner

*Primary Examiner* — Ryan Johnson
(74) *Attorney, Agent, or Firm* — Harness, Dickey & Pierce, P.L.C.

(57) ABSTRACT

An atomic cell includes a pair of windows, and a body disposed between the pair of windows and forming an inner space in which alkali metal atoms are sealed along with the pair of windows. The inner space has a longitudinal shape in which a cross-section perpendicular to an arranging direction of the pair of windows extends in a first direction. Further, when a length of the inner space in a second direction perpendicular to the first direction in the cross-section is set to L1, and a length of the inner space in the first direction is set to L2, a relationship of $L2/L1 \geq 1.1$ is satisfied.

13 Claims, 13 Drawing Sheets

ATOMIC CELL, ATOMIC RESONANCE TRANSITION DEVICE, ATOMIC OSCILLATOR, ELECTRONIC APPARATUS, AND MOVING OBJECT

BACKGROUND

1. Technical Field

The present invention relates to an atomic cell, an atomic resonance transition device, an atomic oscillator, an electronic apparatus, and a moving object.

2. Related Art

An atomic oscillator which oscillates on the basis of energy transition of atoms of an alkali metal such as rubidium or cesium is known as an oscillator which has a high accuracy oscillation characteristic for a long period of time.

Generally, the operation principles of the atomic oscillator are largely classified into a method of using a double resonance phenomenon caused by light and microwaves, and a method of using a quantum interference effect (also referred to as coherent population trapping (CPT)) caused by two types of light beams with different wavelengths.

In an atomic oscillator of either method, typically, an alkali metal is sealed into a gas cell (atomic cell), and the gas cell is heated to a predetermined temperature by a heater in order to maintain the alkali metal in a specific gaseous state.

Here, generally, the entire alkali metal in the gas cell does not become a gas, and part of the alkali metal becomes a liquid as a surplus. Such surplus alkali metal atoms are deposited (condensed) at a location of the gas cell where a temperature is low and thus become a liquid, but shield excitation light if the surplus alkali metal atoms are present in a passing region of the excitation light, and, as a result, an oscillation characteristic of the atomic oscillator deteriorates.

Therefore, in a gas cell related to JP-A-2010-205875, a recess portion for depositing a surplus alkali metal is provided in an inner wall surface of the gas cell.

However, in the gas cell related to JP-A-2010-205875, since a surplus alkali metal which is deposited in the recess portion faces a passing region of excitation light relatively in the vicinity thereof, part of an excited gaseous alkali metal comes into contact with the surplus alkali metal in the recess portion, and thus a state of the excited gaseous alkali metal is nonuniform. As a result, there is a problem that an oscillation characteristic deteriorates (for example, a frequency varies).

SUMMARY

An advantage of some aspects of the invention is to provide an atomic cell, an atomic resonance transition device, and an atomic oscillator capable of minimizing deterioration in characteristics due to surplus metal atoms, and is to provide an electronic apparatus and a moving object including the atomic resonance transition device and having high reliability.

Embodiments of the invention can be implemented as the following forms or application examples.

Application Example 1

This application example is directed to an atomic cell including: a pair of window portions; a body portion that is disposed between the pair of window portions and forms an inner space along with the pair of window portions; and metal atoms that are sealed in the inner space, in which, when lengths in direction perpendicular to each other are L1 and L2 in a cross-section of the inner space intersecting a direction in which the pair of window portions are arranged, a relationship of $L2/L1 \geq 1.1$ is satisfied.

According to the atomic cell, the surplus liquid or solid metal atoms are disposed at one end of the longitudinal portion in the longitudinal direction (first direction), and the light including a pair of resonance light beams for resonating gaseous metal atoms is applied to a position biased toward the other end, so as to increase a width of the light. Therefore, even if a distance between the light and an inner wall surface of the body portion is reduced, a distance between the light and the liquid or solid metal atoms can be increased. As a result, it is possible to minimize deterioration in characteristics due to the surplus metal atoms.

Application Example 2

In the atomic cell according to the application example described above, it is preferable that a longitudinal portion having the cross-section extends in the direction in which the pair of window portions are arranged.

Thus, it is possible to sufficiently secure an amount of the liquid or solid metal atoms which are disposed at one end of the longitudinal portion in the longitudinal direction (first direction).

Application Example 3

In the atomic cell according to the application example described above, it is preferable that L2 is the same over the entire inner space in the direction in which the pair of window portions are arranged.

Therefore, the body portion having a through hole with a constant width may be used, and thus it becomes easier to form the body portion.

Application Example 4

In the atomic cell according to the application example described above, it is preferable that L2 is large at an end part or in the middle of the inner space in the direction in which the pair of window portions are arranged.

Thus, it is possible to easily dispose liquid or solid metal atoms at a desired local position.

Application Example 5

In the atomic cell according to the application example described above, it is preferable that a shape of the cross-section is a curved shape.

Thus, it is possible to reduce a wasteful space of the inner space. As a result, it is possible to make the gas cell small-sized. In addition, a wall surface of the inner space of the gas cell has a curved part, and thus manufacturing of the gas cell is simplified.

Application Example 6

In the atomic cell according to the application example described above, it is preferable that L1 is in a range of 0.5 mm or more and 3 mm or less.

Thus, it is possible to make the gas cell small-sized. Furthermore, in a case where the gas cell is small-sized as mentioned above, it is necessary to increase a width of the light including the pair of resonance light beams in order to increase an amount of the gaseous metal atoms which are irradiated with the light including the pair of resonance light beams as much as possible from the viewpoint of improving an oscillation characteristic. In this case, since the relationship between L1 and L2 is satisfied even if the distance between the light including the pair of resonance light beams and the inner wall surface of the body portion is reduced, it is possible to increase the distance between the light including the pair of resonance light beams and the liquid or solid metal atoms to an extent to which deterioration in characteristics due to the surplus metal atoms can be minimized.

Application Example 7

This application example is directed to an atomic resonance transition device including: the atomic cell according to the application example described above; and a light emitting unit that emits light including a pair of resonance light beams for resonating the metal atoms toward the atomic cell, in which the longitudinal portion includes a metal reservoir at which liquid or solid metal atoms are disposed at one end in a longitudinal direction, and, in which, when a distance between an inner wall surface of the body portion and the light is D1, and a distance between the liquid or solid metal atoms disposed at the metal reservoir and the light is D2, a relationship of $2 \times D1 \leq D2$ is satisfied.

According to the atomic resonance transition device, the surplus liquid or solid metal atoms are disposed at one end of the longitudinal portion in the longitudinal direction (first direction), and the light including a pair of resonance light beams for resonating gaseous metal atoms is applied to a position biased toward the other end, so as to increase a width of the light. Therefore, even if a distance between the light and an inner wall surface of the body portion is reduced, a distance between the light and the liquid or solid metal atoms can be increased. As a result, it is possible to minimize deterioration in characteristics due to the surplus metal atoms.

Application Example 8

In the atomic resonance transition device according to the application example described above, it is preferable that a center of the longitudinal portion and a center of the light are deviated relative to each other in the longitudinal direction when viewed from the direction in which the pair of window portions are arranged.

Thus, it is possible to dispose the surplus liquid or solid metal atoms at one end of the longitudinal portion in the longitudinal direction (first direction), and to apply the light including a pair of resonance light beams for resonating gaseous metal atoms to a position biased toward the other end.

Application Example 9

In the atomic resonance transition device according to the application example described above, it is preferable that D1 is in a range of 0.05 mm or more and 1 mm or less.

Thus, it is possible to increase an amount of gaseous metal atoms irradiated with the light including the pair of resonance light beams, and also to minimize deterioration in characteristics due to other metal atoms having different behaviors around the inner wall surface of the body portion being resonated by the light including the pair of resonance light beams.

Application Example 10

This application example is directed to an atomic resonance transition device including: an atomic cell that includes an inner space in which metal atoms are sealed; and a light emitting unit that emits light including a pair of resonance light beams for resonating the metal atoms toward the atomic cell, in which the inner space includes a metal reservoir at which liquid or solid metal atoms are disposed at part of a wall surface of the inner space, and in which, when a distance between the wall surface of the inner space and the light is D1, and a distance between the liquid or solid metal atoms disposed at the metal reservoir and the light is D2, a relationship of $2 \times D1 \leq D2$ is satisfied.

According to the atomic resonance transition device, the surplus liquid or solid metal atoms are disposed at one end of the longitudinal portion in the longitudinal direction (first direction), and the light including a pair of resonance light beams for resonating gaseous metal atoms is applied to a position biased toward the other end, so as to increase a width of the light. Therefore, even if a distance between the light and an inner wall surface of the body portion is reduced, a distance between the light and the liquid or solid metal atoms can be increased. As a result, it is possible to minimize deterioration in characteristics due to the surplus metal atoms.

Application Example 11

This application example is directed to an atomic oscillator including the atomic resonance transition device according to the application example described above.

Thus, it is possible to provide an atomic oscillator capable of minimizing deterioration in characteristics due to surplus metal atoms.

Application Example 12

This application example is directed to an electronic apparatus including the atomic resonance transition device according to the application example described above.

Thus, it is possible to provide an electronic apparatus with high reliability.

Application Example 13

This application example is directed to a moving object including the atomic resonance transition device according to the application example described above.

Thus, it is possible to provide a moving object with high reliability.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, an atomic cell, an atomic resonance transition device, an atomic oscillator, an electronic apparatus, and a moving object according to embodiments of the invention will be described in detail with reference to the accompanying drawings.

1. Atomic Oscillator (Quantum Interference Device)

First, an atomic oscillator (an atomic oscillator including an atomic resonance transition device according to an embodiment of the invention) will be described. In addition, hereinafter, an example in which an atomic resonance transition device according to an embodiment of the invention is applied to an atomic oscillator (quantum interference device) will be described, but the invention is not limited thereto, and the atomic resonance transition device is applicable to, for example, a magnetic sensor and a quantum memory.

First Embodiment

Figure 1:
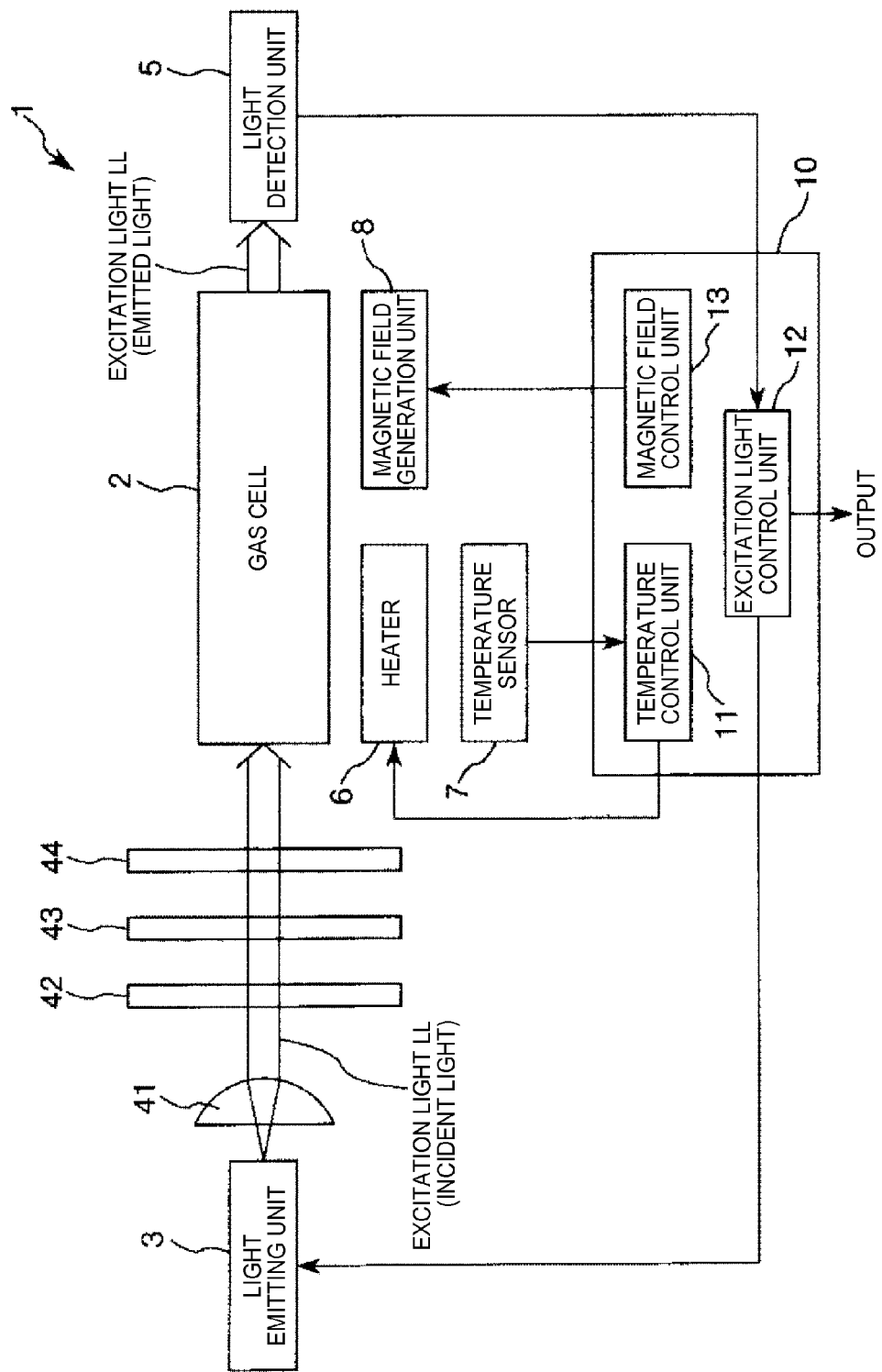
FIG. 1 is a schematic diagram illustrating an atomic oscillator (atomic resonance transition device) according to a first embodiment of the invention.
Figure 2:
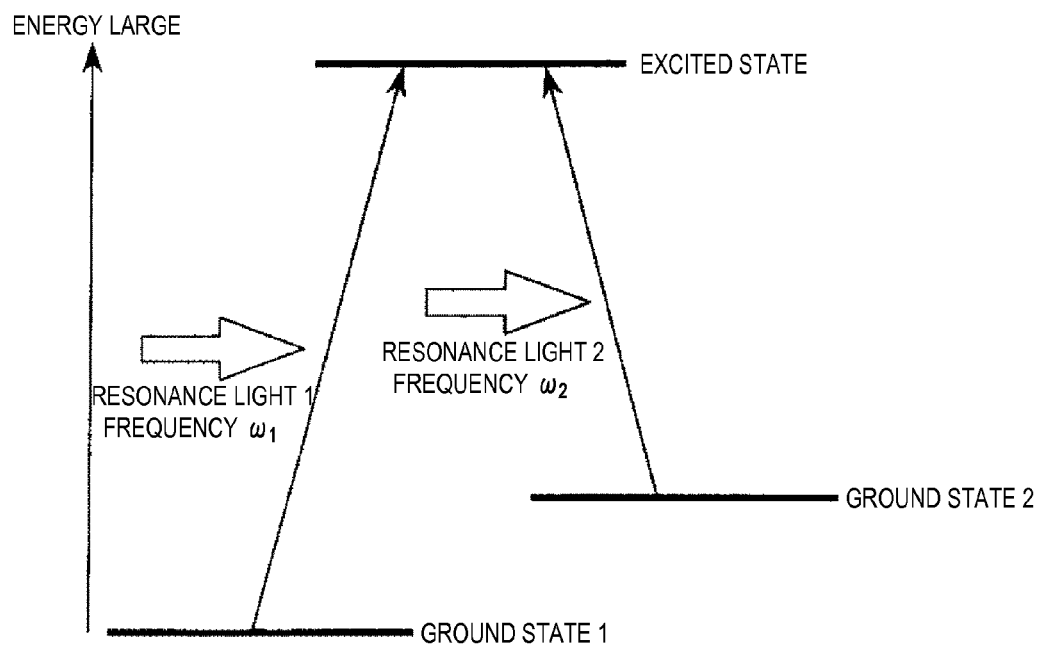
FIG. 2 is a diagram illustrating an energy state of an alkali metal.
Figure 3:
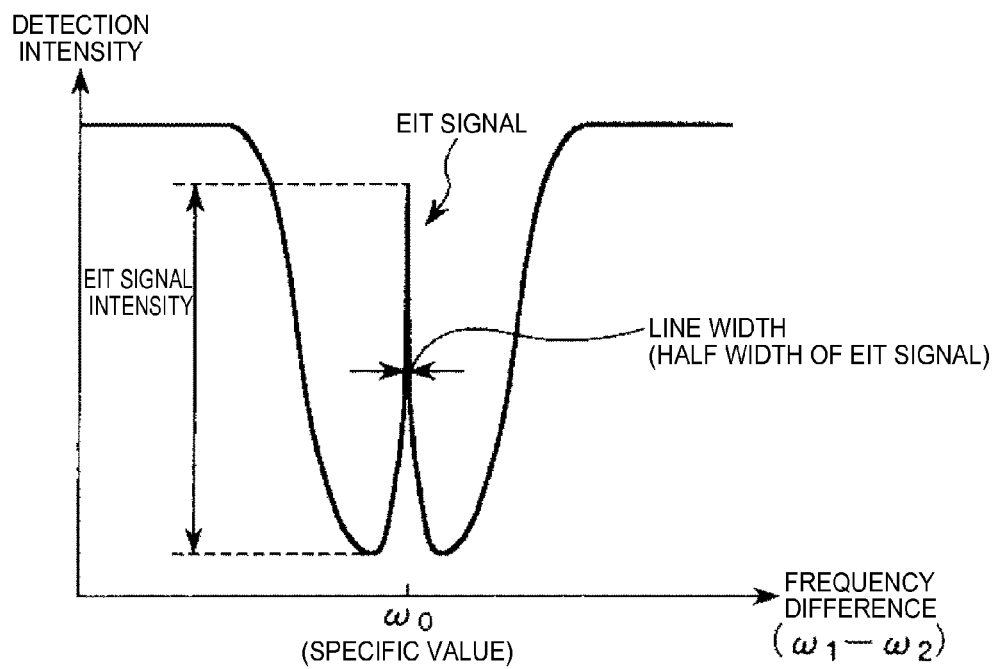
FIG. 3 is a graph illustrating a relationship between a frequency difference between two light beams emitted from a light emitting unit, and an intensity of light detected by a light detection unit.

FIG. 1 is a schematic diagram illustrating an atomic oscillator (atomic resonance transition device) according to a first embodiment of the invention. In addition, FIG. 2 is a diagram illustrating an energy state of an alkali metal, and FIG. 3 is a graph illustrating a relationship between a frequency difference between two light beams emitted from a light emitting unit, and an intensity of light detected by a light detection unit.

The atomic oscillator 1 illustrated in FIG. 1 is an atomic oscillator using a quantum interference effect.

The atomic oscillator 1 includes, as illustrated in FIG. 1, a gas cell 2 (atomic cell), a light emitting unit 3, optical components 41, 42, 43 and 44, a light detection unit 5, a heater 6, a temperature sensor 7, a magnetic field generation unit 8, and a controller 10.

First, a principle of the atomic oscillator 1 will be briefly described.

As illustrated in FIG. 1, in the atomic oscillator 1, the light emitting unit 3 emits excitation light LL toward the gas cell 2, and the light detection unit 5 detects the excitation light LL which has been transmitted through the gas cell 2.

A gaseous alkali metal (metal atoms) is sealed into the gas cell 2. The alkali metal has energy levels of a three-level system as illustrated in FIG. 2, and may take three states including two ground states (ground states 1 and 2) with different energy levels and an excited state. Here, the ground state 1 is an energy state lower than the ground state 2.

The excitation light LL emitted from the light emitting unit 3 includes two types of resonance light beams 1 and 2. When the above-described gaseous alkali metal is irradiated with the two types of resonance light beams 1 and with different frequencies, light absorptance (light transmittance) of the resonance light beams 1 and 2 in the alkali metal varies depending on a difference ($\omega1-\omega2$) between a frequency $\omega1$ of the resonance light 1 and a frequency $\omega2$ of the resonance light 2.

In addition, when the difference ($\omega1-\omega2$) between the frequency $\omega1$ of the resonance light 1 and the frequency $\omega2$ of the resonance light 2 matches a frequency corresponding to an energy difference between the ground state 1 and the ground state 2, excitation from the ground states 1 and 2 to the excited state stops, respectively. At this time, neither of the resonance light beams 1 and 2 is absorbed by the alkali metal, but both are transmitted therethrough. This phenomenon is called a CPT phenomenon or an electromagnetically induced transparency (EIT) phenomenon.

For example, if the light emitting unit 3 fixes the frequency $\omega1$ of the resonance light 1 to a certain value and changes the frequency $\omega2$ of the resonance light 2, when the difference ($\omega1-\omega2$) between the frequency $\omega1$ of the resonance light 1 and the frequency $\omega2$ of the resonance light 2 matches a frequency $\omega0$ corresponding to an energy difference between the ground state 1 and the ground state 2, an intensity detected by the light detection unit 5 rapidly increases as illustrated in FIG. 3. This rapidly increasing signal is detected as an EIT signal. The EIT signal has an inherent value which is defined by the kind of alkali metal. Therefore, an oscillator can be formed by using such an EIT signal.

Hereinafter, each unit of the atomic oscillator 1 will be described in detail in order.

Gas Cell

An alkali metal such as gaseous rubidium, cesium or sodium is sealed into the gas cell 2. In addition, a rare gas such as argon or neon, or an inert gas such as nitrogen may be sealed into the gas cell 2 as a buffer gas along with the alkali metal gas.

Although described later in detail, the gas cell 2 includes a body portion 21 and a pair of window portions 22 and 23 (transparent plates) with the body portion 21 interposed therebetween, and an inner space S1 into which a gaseous alkali metal and a surplus liquid or solid alkali metal are sealed is formed by the body portion 21 and the pair of window portions 22 and 23 (refer to FIGS. 5 and 6). In addition, a configuration of the gas cell 2 will be described later in detail along with a description of a positional relationship between the inner space S1 and the excitation light LL.

A temperature of the gas cell 2 is adjusted to, for example, about 70° C. by the heater 6.

Light Emitting Unit

The light emitting unit 3 (light source) has a function of emitting the excitation light LL for exciting alkali metal atoms in the gas cell 2.

More specifically, the light emitting unit 3 emits the above-described two types of light beams (the resonance light 1 and the resonance light 2) with different frequencies as the excitation light LL.

The resonance light 1 can excite (resonate) the alkali metal in the gas cell 2 from the above-described ground state 1 to the excited state. On the other hand, the resonance light 2 can excite (resonate) the alkali metal in the gas cell 2 from the above-described ground state 2 to the excited state.

The light emitting unit 3 is not particularly limited as long as the above-described excitation light can be emitted, but, for example, a semiconductor laser such as a vertical cavity surface emitting laser (VCSEL) may be used.

The light emitting unit 3 is connected to an excitation light control unit 12 of the controller 10 described later, and is controlled to be driven on the basis of a detection result of the light detection unit 5 (refer to FIG. 1).

In addition, a temperature of the light emitting unit 3 is adjusted to a predetermined temperature by a temperature adjustment element (a heating resistor, a Peltier element, or the like) (not illustrated).

Optical Components

The plurality of optical components 41, 42, 43 and 44 are provided along an optical path of the excitation light LL between the light emitting unit 3 and the gas cell 2.

Here, the optical component 41, the optical component 42, the optical component 43, and the optical component 44 are disposed in this order from the light emitting unit 3 side to the gas cell 2 side.

The optical component 41 is a lens. Accordingly, the excitation light LL can be applied to the gas cell 2 without any waste.

In addition, the optical component 41 has a function of converting the excitation light LL into parallel light. Thus, it is possible to easily and reliably prevent the excitation light LL from being reflected at an inner wall of the gas cell 2. For this reason, resonance of the excitation light can be suitably caused in the gas cell 2, and, as a result, an oscillation characteristic of the atomic oscillator 1 can be improved.

The optical component 42 is a polarization plate. Thus, polarization of the excitation light LL from the light emitting unit 3 can be adjusted in a predetermined direction.

The optical component 43 is a dimming filter (ND filter). Thus, an intensity of the excitation light LL incident to the gas cell 2 can be adjusted (reduced). For this reason, even in a case where an output level of the light emitting unit 3 is high, the excitation light incident to the gas cell 2 can be adjusted to a desired light amount. In the present embodiment, an intensity of the excitation light LL which has passed through the optical component 42 and has polarization in a predetermined direction is adjusted by the optical component 43.

The optical component 44 is a λ4 wavelength plate (a ¼ wavelength plate). Thus, the excitation light LL from the light emitting unit 3 can be converted from linearly polarized light into circularly polarized light (right-handed circularly polarized light or left-handed circularly polarized light).

As described later, in a state in which the alkali metal atoms in the gas cell 2 are Zeeman-split by a magnetic field of the magnetic field generation unit 8, if linearly polarized excitation light is applied to the alkali metal atoms, the alkali metal atoms are uniformly distributed to and are present in a plurality of levels in which the alkali metal atoms are Zeeman-split due to an interaction between the excitation light and the alkali metal atoms. As a result, since the number of alkali metal atoms with a desired energy level becomes smaller than the number of alkali metal atoms with other energy levels, the number of atoms showing a desired EIT phenomenon is decreased, thus an intensity of a desired EIT signal is reduced, and, as a result, an oscillation characteristic of the atomic oscillator 1 deteriorates.

In contrast, as described later, in a state in which the alkali metal atoms in the gas cell 2 are Zeeman-split by a magnetic field of the magnetic field generation unit 8, if circularly polarized excitation light is applied to the alkali metal atoms, the number of alkali metal atoms with a desired energy level can be made larger than the number of alkali metal atoms with other energy levels among a plurality of levels in which the alkali metal atoms are Zeeman-split. For this reason, the number of atoms showing a desired EIT phenomenon is increased, thus an intensity of a desired EIT signal is also increased, and, as a result, an oscillation characteristic of the atomic oscillator 1 can be improved.

Light Detection Unit

The light detection unit 5 has a function of detecting an intensity of the excitation light LL (the resonance light beams 1 and 2) which has been transmitted through the gas cell 2.

The light detection unit 5 is not particularly limited as long as the excitation light can be detected, but, for example, a light detector (light receiving element) such as a solar cell or a photodiode may be used.

The light detection unit 5 is connected to the excitation light control unit 12 of the controller 10 described later (refer to FIG. 1).

Heater

The heater 6 (heating unit) has a function of heating the above-described gas cell 2 (more specifically, the alkali metal in the gas cell 2). Thus, the alkali metal in the gas cell 2 can be maintained in a gaseous phase of an appropriate concentration.

The heater 6 generates heat due to conduction (DC), and is formed by, for example, two heating resistors (not illustrated) provided on an outer surface of the gas cell 2.

Here, one heating resistor is provided at the window portion 22 (incidence side window portion) of the gas cell 2, and the other heating resistor is provided at the window portion (emission side window portion) of the gas cell 2. The heating resistors are respectively provided at the window portions 22 and 23, and thus the alkali metal atoms can be prevented from being condensed at the window portions 22 and of the gas cell 2. As a result, a characteristic (oscillation characteristic) of the atomic oscillator 1 can be made favorable for a long period of time.

These heating resistors are made of a material which transmits excitation light therethrough, specifically, a transparent electrode material such as an oxide, for example, indium tin oxide (ITO), indium zinc oxide (IZO), $In_2O_3$, $SnO_2$, Sb-containing $SnO_2$, or Al-containing ZnO.

In addition, the heating resistors may be formed by using, for example, chemical vapor deposition (CVD) such as plasma CVD or thermal CVD, dry plating such as vacuum deposition, a sol/gel method, or the like.

In addition, the heater 6 is not limited to the above-described form as long as the gas cell 2 can be heated, and may use various heaters. Further, the heater 6 may not be in contact with the gas cell 2. Furthermore, the gas cell 2 may be heated by using a Peltier element instead of the heater 6 or along with the heater 6.

The heater 6 is electrically connected to a temperature control unit 11 of the controller 10 described later so as to be conducted (refer to FIG. 1).

Temperature Sensor

The temperature sensor 7 detects a temperature of the heater 6 or the gas cell 2. In addition, a heating amount of the above-described heater 6 is controlled on the basis of a detection result from the temperature sensor 7. Thus, the alkali metal atoms in the gas cell 2 can be maintained at a desired temperature.

In addition, a position where the temperature sensor 7 is installed is not particularly limited, and, for example, the temperature sensor 7 may be installed on the heater 6, and may be installed on the outer surface of the gas cell 2.

The temperature sensor 7 is not particularly limited, and may use well-known temperature sensors such as a thermistor and a thermocouple.

The temperature sensor 7 is electrically connected to the temperature control unit 11 of the controller 10 described later via a wiring (not illustrated) (refer to FIG. 1).

Magnetic Field Generation Unit

The magnetic field generation unit 8 has a function of generating a magnetic field for Zeeman-splitting a plurality of degenerated energy levels of the alkali metal in the gas cell 2. Thus, gaps between degenerated other energy levels of the alkali metal are enlarged by the Zeeman splitting, and thus a resolution can be improved. As a result, it is possible to increase accuracy of an oscillation frequency of the atomic oscillator 1.

The magnetic field generation unit 8 is formed by, for example, Helmholtz coils which are disposed with the gas cell 2 interposed therebetween, or a solenoid coil disposed so as to cover the gas cell 2. Thus, it is possible to cause a uniform magnetic field in one direction in the gas cell 2.

In addition, a magnetic field generated by the magnetic field generation unit 8 is a constant magnetic field (DC magnetic field), but AC magnetic fields may overlap each other.

The magnetic field generation unit 8 is electrically connected to a magnetic field control unit 13 of the controller 10 described later, and is controlled to be conducted (refer to FIG. 1).

Controller

The controller 10 has a function of controlling each of the light emitting unit 3, the heater 6, and the magnetic field generation unit 8.

The controller 10 includes the excitation light control unit 12 which controls frequencies of the resonance light beams 1 and 2 from the light emitting unit 3, the temperature control unit 11 which controls a temperature of the alkali metal in the gas cell 2, and the magnetic field control unit 13 which controls a magnetic field from the magnetic field generation unit 8.

The excitation light control unit 12 controls frequencies of the resonance light beams 1 and 2 which are emitted from the light emitting unit 3 on the basis of a detection result from the above-described light detection unit 5. More specifically, the excitation light control unit 12 controls frequencies of the resonance light beams 1 and 2 emitted from the light emitting unit 3 so that ($\omega 1 - \omega 2$) detected by the light detection unit 5 becomes the inherent frequency $\omega 0$ of the alkali metal.

In addition, although not illustrated, the excitation light control unit 12 is provided with a voltage controlled quartz crystal oscillator (oscillation circuit), and outputs an oscillation frequency of the voltage controlled quartz crystal oscillator as an output signal of the atomic oscillator 1 while synchronously adjusting the oscillation frequency on the basis of a detection result from the light detection unit 5.

In addition, the temperature control unit 11 controls a current which flows to the heater 6 on the basis of a detection result from the temperature sensor 7. Thus, the gas cell 2 can be maintained in a desired temperature range.

Further, the magnetic field control unit 13 controls a current which flows to the magnetic field generation unit 8 so as to make a magnetic field generated by the magnetic field generation unit 8 constant.

The controller 10 is provided in, for example, an IC chip mounted on a board.

Positional Relationship Between the Inner Space of the Gas Cell and Excitation Light Next, description will be made of a positional relationship between the inner space S1 of the gas cell 2 and the excitation light LL.

Figure 4:
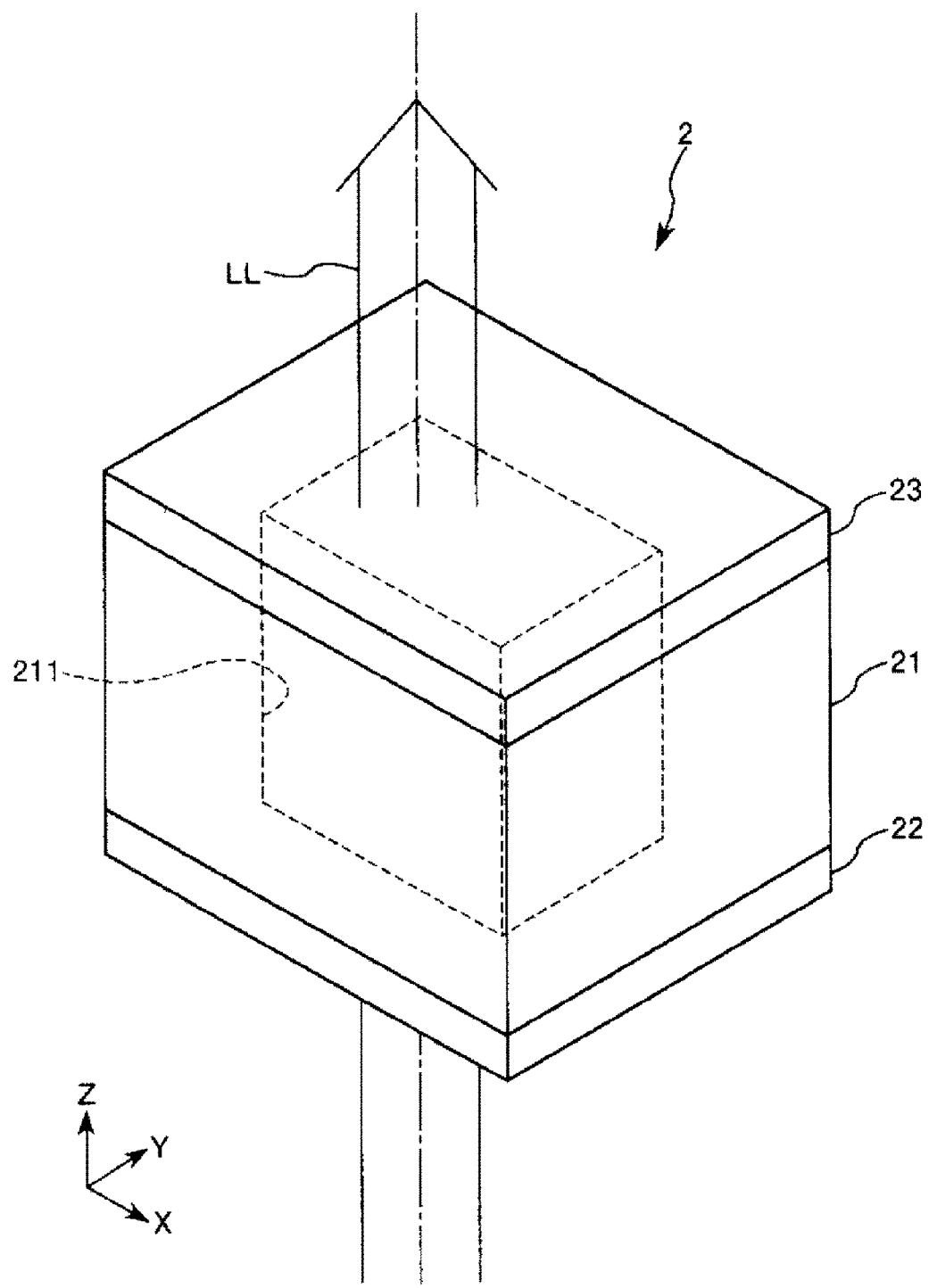
FIG. 4 is a perspective view of a gas cell included in the atomic oscillator illustrated in FIG. 1.
Figure 5:
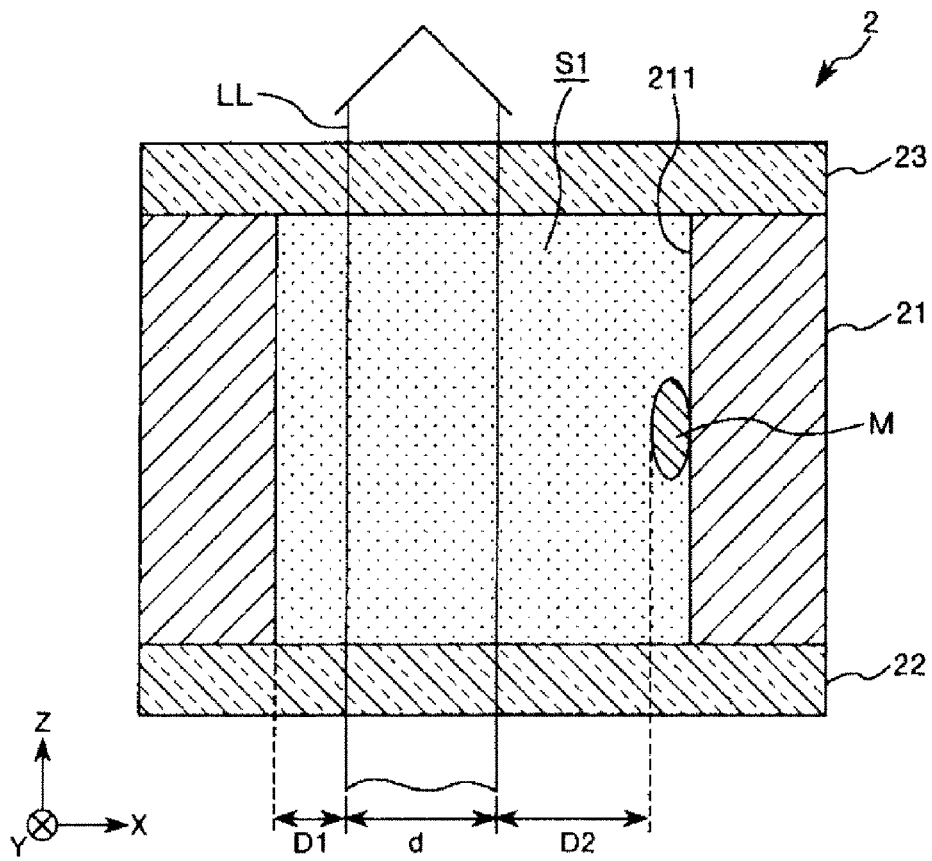
FIG. 5 is a longitudinal cross-sectional view of the gas cell illustrated in FIG. 4.
Figure 6:
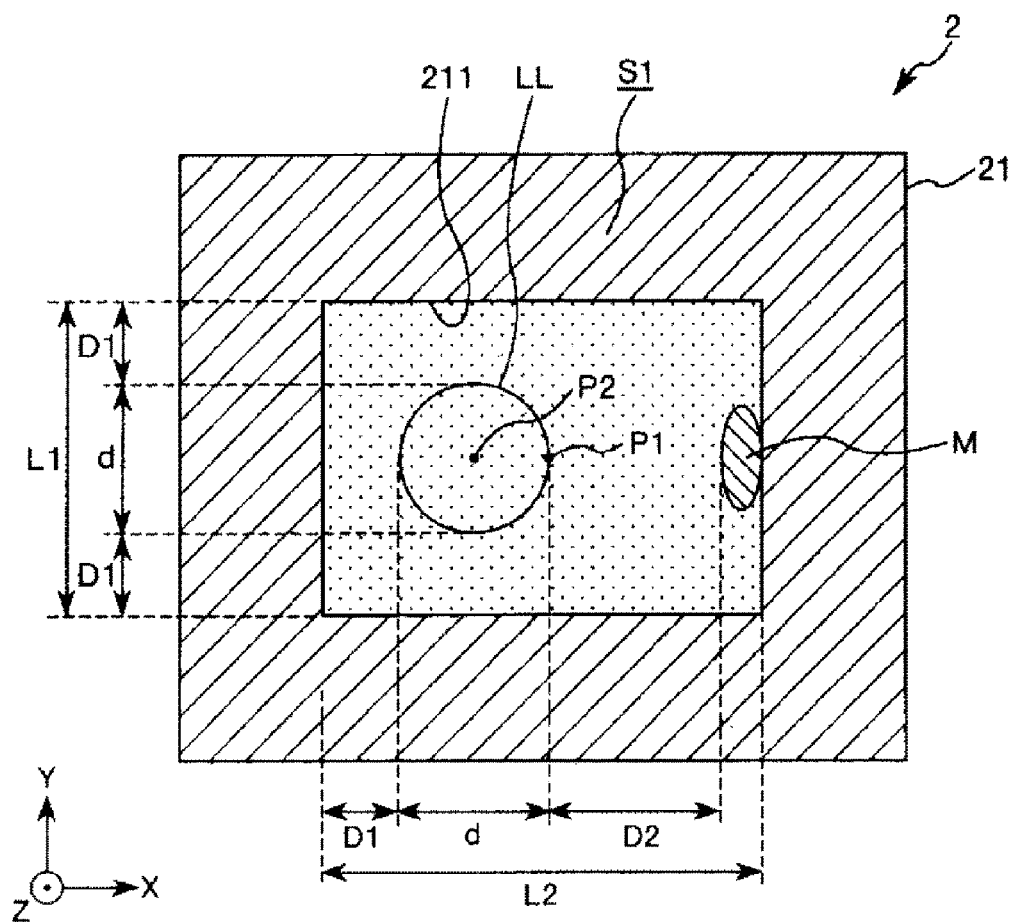
FIG. 6 is a transverse cross-sectional view of the gas cell illustrated in FIG. 4.
Figure 7:
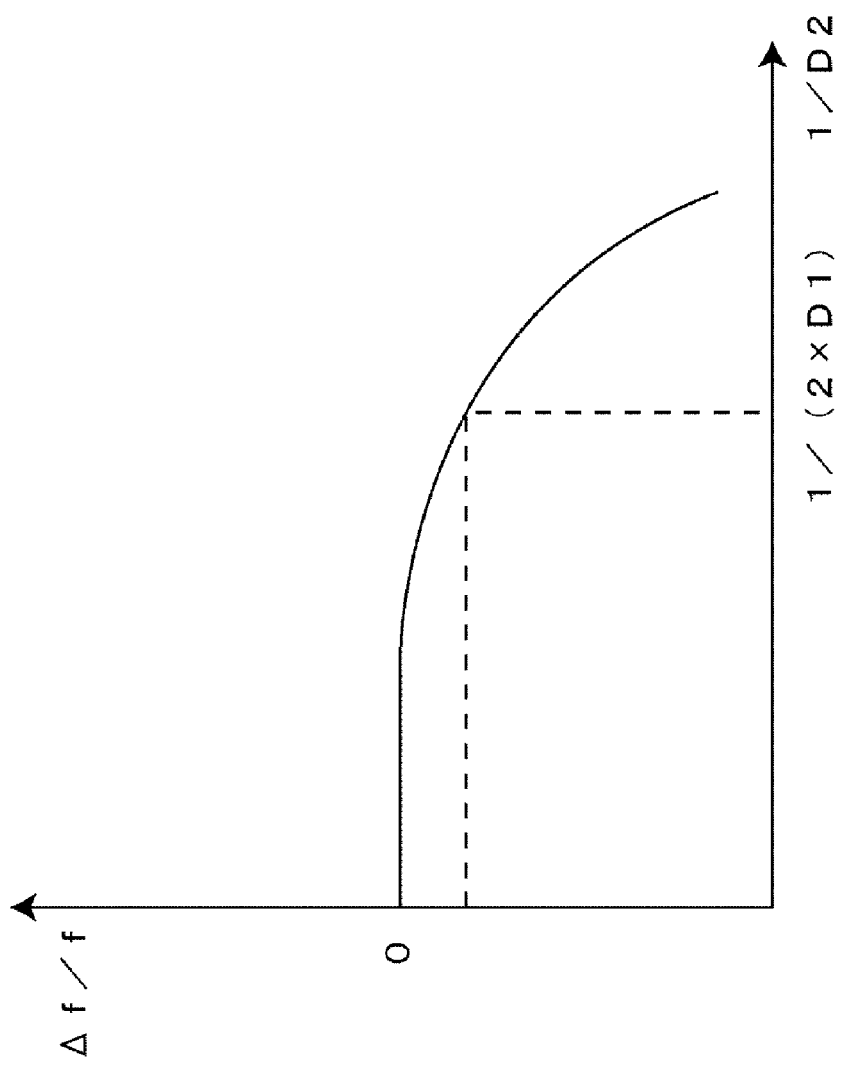
FIG. 7 is a graph illustrating a relationship between distances and frequency stability.

FIG. 4 is a perspective view of the gas cell included in the atomic oscillator illustrated in FIG. 1, FIG. 5 is a longitudinal cross-sectional view of the gas cell illustrated in FIG. 4, and FIG. 6 is a transverse cross-sectional view of the gas cell illustrated in FIG. 4. In addition, FIG. 7 is a graph illustrating a relationship between distances D1 and D2 and frequency stability Δf/f.

In addition, in FIGS. 4 to 6, for convenience of description, an X axis, a Y axis, and a Z axis are illustrated as three axes which are perpendicular to each other, and a tip end side of each arrow illustrated in each drawing is referred to as "+ (positive)", and a base end side is referred to as "– (negative)". Further, hereinafter, for convenience of description, a direction parallel to the X axis is referred to as an "X axis direction", a direction parallel to the Y axis is referred to as a "Y axis direction", and a direction parallel to the Z axis is referred to as a "Z axis direction".

First, a configuration of the gas cell 2 will be described briefly.

As illustrated in FIGS. 4 and 5, the gas cell 2 includes the body portion 21, and the pair of window portions 22 and 23 provided with the body portion 21 interposed therebetween.

A columnar through hole 211 which penetrates through the body portion 21 in the Z axis direction is provided therein.

A material forming the body portion 21 is not particularly limited, and may be a glass material, a quartz crystal, a metal material, a resin material, a silicon material, and the like, but, among them, any one of the glass material, the quartz crystal, and the silicon material is preferably used, and the silicon material is more preferably used. Thus, even in a case where the small gas cell 2 whose width or height is 10 mm or less, it is possible to easily form the high accuracy body portion 21 by using a micro-processing technique such as etching.

The window portion 22 is joined to an end surface of the body portion 21 on the −Z axis direction side, and, on the other hand, the window portion 23 is joined to an end surface of the body portion 21 on the +Z axis direction side. Thus, as illustrated in FIGS. 5 and 6, the inner space S1 is formed by the through hole 211.

A method of joining the body portion 21 to the window portions 22 and 23 is not particularly limited as long as the method is defined according to a forming material, and the portions can be air-tightly joined to each other, but, for example, a joint method using an adhesive, a direct joint method, and an anodic joint method may be used.

Each of the window portions 22 and 23 has a plate shape, and is provided so that a plate surface is perpendicular to an axis of the excitation light LL.

In addition, each of the window portions 22 and 23 transmits the excitation light LL from the light emitting unit 3 therethrough. Further, one window portion 22 is an incidence side window portion through which the excitation light LL is incident to the inner space S1 of the gas cell 2, and the other window portion 23 is an emission side window portion through which the excitation light LL is emitted from the inner space S1 of the gas cell 2.

A material forming the window portions 22 and 23 is not particularly limited as long as the material can transmit excitation light therethrough, but, may use, for example, a glass material and a quartz crystal. In a case where the window portions 22 and 23 are made of the glass material, the body portion 21 made of the silicon material and the window portions 22 and 23 can be easily air-tightly joined to each other by using an anodic joint method. In addition, the window portions 22 and 23 may be made of silicon depending on thicknesses of the window portions 22 and 23 or an intensity of excitation light.

The gaseous alkali metal is stored in the inner space S1. The gaseous alkali metal stored in the inner space S1 is excited by the excitation light LL.

In addition, a surplus liquid or solid alkali metal M is stored in the inner space S1. Particularly, the liquid or solid alkali metal M is disposed at an end of the inner space S1 on the +X axis direction side, and forms a "metal reservoir". The alkali metal M is changed to a gas so as to be provided for excitation of the excitation light LL when the gaseous alkali metal in the inner space S1 is insufficient.

Particularly, as illustrated in FIG. 6, the inner space S1 has a rectangular shape in which a cross-section perpendicular to the Z axis (that is, a cross-section perpendicular to the direction in which the pair of window portions 22 and 23 are arranged) extends in the X axis direction (first direction). In addition, when a length of the inner space S1 in the Y axis direction (second direction) perpendicular to the X axis direction in this cross-section is set to L1, and a length of the inner space S1 in the X axis direction in the cross-section is set to L2, a relationship of $L2/L1 \geq 1.1$ is satisfied.

With this relationship between L1 and L2, in a state in which the surplus liquid or solid alkali metal M is disposed at one end of the inner space S1 in the X axis direction as described above, the excitation light LL is applied to a position biased toward the other end of the inner space S1 in the X axis direction, so as to increase a width d of the excitation light LL. Therefore, even if a distance D1 between the excitation light LL and an inner wall surface of the body portion 21 is reduced, a distance D2 between the excitation light LL and the liquid or solid alkali metal M can be increased. As a result, it is possible to minimize deterioration in characteristics due to the surplus alkali metal M.

Specifically, when a distance between the inner wall surface of the body portion 21 and the excitation light LL is set to D1, and a distance between the liquid or solid alkali metal M and the excitation light LL is set to D2, a relationship of $2 \times D1 \leq D2$ is satisfied. Thus, even if the distance D1 between the excitation light LL and the inner wall surface of the body portion 21 is reduced as a result of the width d of the excitation light LL being increased, the distance D2 between the excitation light LL and the liquid or solid alkali metal M can be increased.

As a result of measuring frequency stability $\Delta f/f$ by changing the distance D2, as illustrated in FIG. 7, if $1/D2$ is equal to or less than $1/(2 \times D1)$, the frequency stability $\Delta f/f$ is favorable, and if $1/D2$ exceeds $1/(2 \times D1)$, the frequency stability $\Delta f/f$ rapidly deteriorates.

In other words, if D2 is equal to or more than $(2 \times D1)$, the frequency stability $\Delta f/f$ is favorable, and if D2 is less than $(2 \times D1)$, the frequency stability $\Delta f/f$ rapidly deteriorates.

From this viewpoint, since the distance D2 is required to be secured as relatively long, the above-described relationship of $L2/L1 \geq 1.1$ is derived.

In addition, L1 and L2 satisfy the above-described relationship, but preferably satisfy a relationship of $1.3 \leq L2/L1 \leq 2$, and more preferably satisfy a relationship of $1.5 \leq L2/L1 \leq 1.8$. Thus, it is possible to reduce a wasteful space in the inner space S1 while satisfying the relationship between D1 and D2. Further, in a case where the wasteful space of the inner space S1 of the gas cell 2 is not problematic, even if the relationship between L1 and L2 is not satisfied as long as the relationship between D1 and D2 is satisfied, it is possible to achieve an effect of minimizing deterioration in characteristics due to the surplus alkali metal M.

In the present embodiment, the inner space S1 is rectangular, and, on the other hand, the excitation light LL is circular, when viewed from the Z axis direction.

Here, when viewed from the Z axis direction, a center P1 of the inner space S1 (longitudinal portion) and a center P2 of the excitation light LL are deviated relative to each other in the X axis direction. Thus, the surplus liquid or solid alkali metal M can be disposed at one end of the inner space S1 in the X axis direction, and the excitation light LL can be applied to a position biased toward the other end thereof. In addition, the center P1 of the inner space S1 (longitudinal portion) is a geometrical centroid of the inner space S1 (longitudinal portion) when viewed from the Z axis direction, and, similarly, the center P2 of the excitation light LL is a geometrical centroid (central axis) of the excitation light LL when viewed from the Z axis direction.

Further, in the present embodiment, the length L2 of the inner space S1 in the X axis direction is constant over the entire inner space S1 in the Z axis direction (that is, a direction in which the pair of window portions 22 and 23 are arranged). Here, a part in which the cross-section perpendicular to the Z axis satisfies the relationship between L1 and L2 forms the "longitudinal portion" and the longitudinal portion is provided over the entire inner space S1 in the Z axis direction.

As mentioned above, since the longitudinal portion extends in the Z axis direction, it is possible to sufficiently secure an amount of the liquid or solid alkali metal M which is disposed at one end of the longitudinal portion in a longitudinal direction (X axis direction).

In addition, since the longitudinal portion is provided over the entire inner space S1 in the Z axis direction, the body portion 21 having the through hole 211 with a constant width may be used, and thus it becomes easier to form the body portion 21. The through hole 211 can be relatively easily formed with high accuracy by using wet etching, for example, in a case where the body portion 21 is made of a silicon material or a glass material.

Further, the length L1 is preferably 0.5 mm or more and 3 mm or less, and more preferably 1 mm or more and 2.5 mm or less. Thus, it is possible to make the gas cell 2 small-sized. Furthermore, in a case where the gas cell 2 is small-sized as mentioned above, it is necessary to increase the width d of the excitation light LL in order to increase an amount of the gaseous alkali metal atoms which are irradiated with the excitation light LL as much as possible from the viewpoint of improving an oscillation characteristic. In this case, since the relationship between L1 and L2 or the relationship between D1 and D2 is satisfied even if the distance D1 between the excitation light LL and the inner wall surface of the body portion 21 is reduced, it is possible to increase the distance D2 between the excitation light LL and the atoms of the liquid or solid alkali metal M to an extent to which deterioration in characteristics due to the atoms of the surplus alkali metal M can be minimized.

In addition, the distance D1 is preferably 0.05 mm or more and 1 mm or less, more preferably 0.1 mm or more and 0.8 mm or less, and the most preferably 0.2 mm or more and 0.6 mm or less. Thus, it is possible to increase an amount of gaseous alkali metal atoms irradiated with the excitation light LL, and also to minimize deterioration in characteristics due to other atoms of the alkali metal having different behaviors around the inner wall surface of the body portion 21 being resonated by the excitation light LL.

According to the above-described atomic oscillator 1, since the surplus liquid or solid alkali metal M is disposed at one end of the inner space S1 forming the longitudinal portion in the X axis direction, and the excitation light LL is applied to the position biased toward the other end, even if the distance D1 between the excitation light LL and the inner wall surface of the body portion 21 is reduced as a result of the width d of the excitation light LL being increased, it is possible to increase the distance D2 between the excitation light LL and the liquid or solid alkali metal M. Therefore, it is possible to minimize deterioration in characteristics due to the surplus alkali metal M.

Second Embodiment

Next, a second embodiment of the invention will be described.

Figure 8:
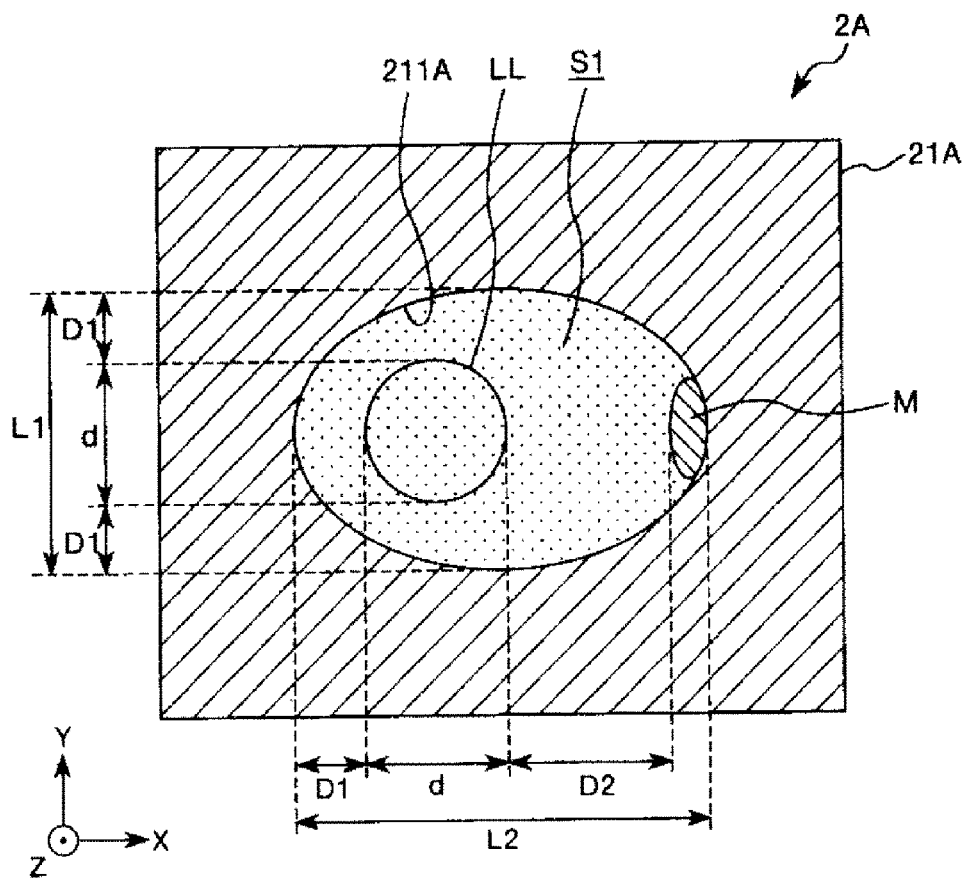
FIG. 8 is a transverse cross-sectional view illustrating a gas cell according to a second embodiment of the invention.

FIG. 8 is a transverse cross-sectional view of a gas cell according to the second embodiment of the invention.

The present embodiment is the same as the first embodiment except for a difference in a transverse cross-sectional shape of an inner space of the atomic cell.

In addition, in the following description, as to the second embodiment, differences from the above-described embodiment will be mainly described, and description of the same content will be omitted. Further, in FIG. 8, the same constituent elements as in the above-described embodiment are given the same reference numerals.

A gas cell 2A (atomic cell) illustrated in FIG. 8 includes a body portion 21A instead of the body portion 21 of the first embodiment.

A columnar through hole 211A which penetrates through the body portion 21A in the Z axis direction is formed therein. The through hole 211A has an elliptical shape or an oval shape when viewed from the Z axis direction.

In other words, a cross-sectional shape of the inner space S1 (longitudinal portion) in a direction perpendicular to the Z axis direction is an elliptical shape or an oval shape. As mentioned above, a contour of the cross-sectional shape is curved, and thus it is possible to reduce a wasteful space of the inner space S1. As a result, it is possible to make the gas cell 2A small-sized. In addition, a wall surface of the inner space S1 of the gas cell 2A has a curved part, and thus manufacturing of the gas cell 2A is simplified.

Also in the above-described second embodiment, it is possible to minimize deterioration in characteristics due to the surplus alkali metal M.

Third Embodiment

Next, a third embodiment of the invention will be described.

Figure 9:
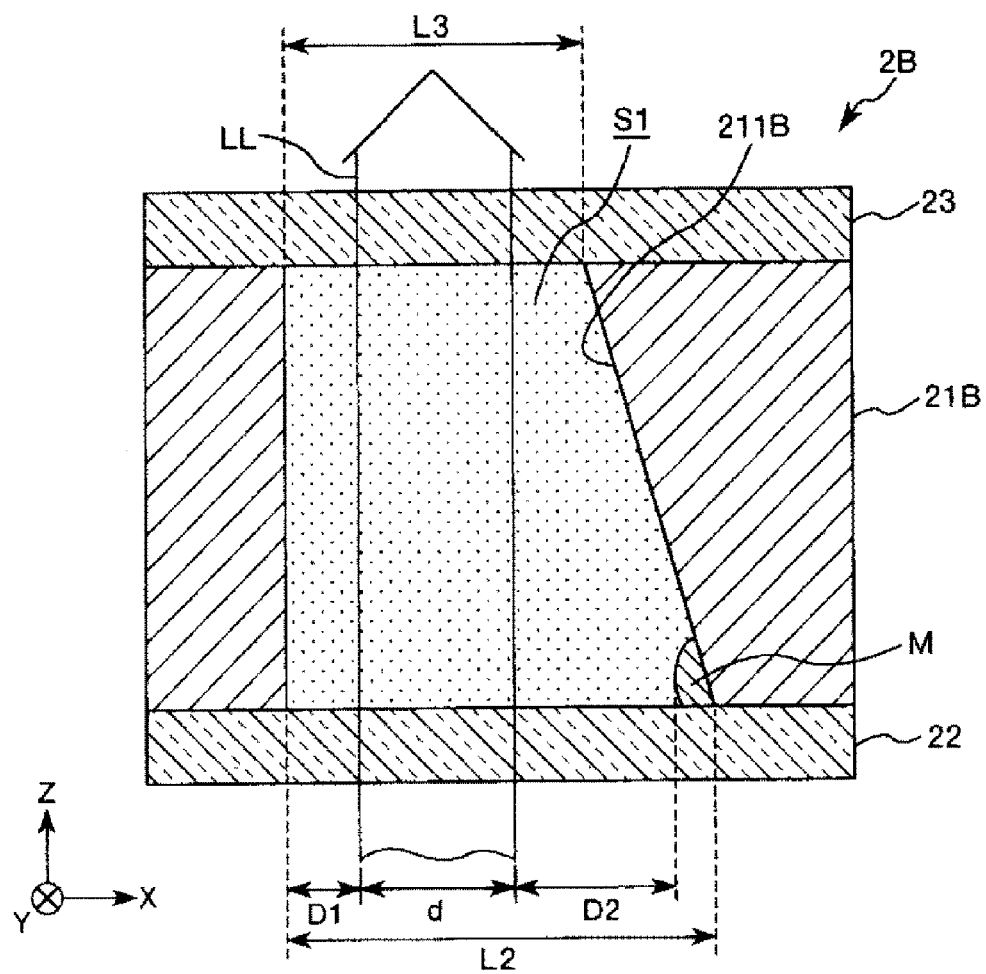
FIG. 9 is a longitudinal cross-sectional view illustrating a gas cell according to a third embodiment of the invention.

FIG. 9 is a longitudinal cross-sectional view of a gas cell according to the third embodiment of the invention.

The present embodiment is the same as the first embodiment except for a difference in a longitudinal cross-sectional shape of an inner space of the atomic cell.

In addition, in the following description, as to the third embodiment, differences from the above-described embodiments will be mainly described, and description of the same content will be omitted. Further, in FIG. 9, the same constituent elements as in the above-described embodiments are given the same reference numerals.

A gas cell 2B (atomic cell) illustrated in FIG. 9 includes a body portion 21B instead of the body portion 21 of the first embodiment.

A columnar through hole 211B which penetrates through the body portion 21B in the Z axis direction is formed therein. The through hole 211B has a width in the X axis direction which is gradually (in the present embodiment, continuously) increased from the +Z axis direction side toward the −Z axis direction side.

In other words, a length of the inner space S1 in the X axis direction is increased at one end of the inner space S1 in the Z axis direction, and one end forms a "longitudinal portion". Thus, it is possible to easily dispose atoms of the liquid or solid alkali metal M at a desired local position (the end part of the inner space S1 on the −Z axis direction side in FIG. 9).

Here, the end part of the inner space S1 on the −Z axis direction side has L2 as a length in the X axis direction, and the end part of the inner space S1 on the +Z axis direction side has L3 smaller than L2 as a length in the X axis direction. The length L3 is preferably the same as or larger than the length L1 from the viewpoint of securing a passing region of the excitation light LL.

Also in the above-described third embodiment, it is possible to minimize deterioration in characteristics due to the surplus alkali metal M.

Fourth Embodiment

Next, a fourth embodiment of the invention will be described.

Figure 10:
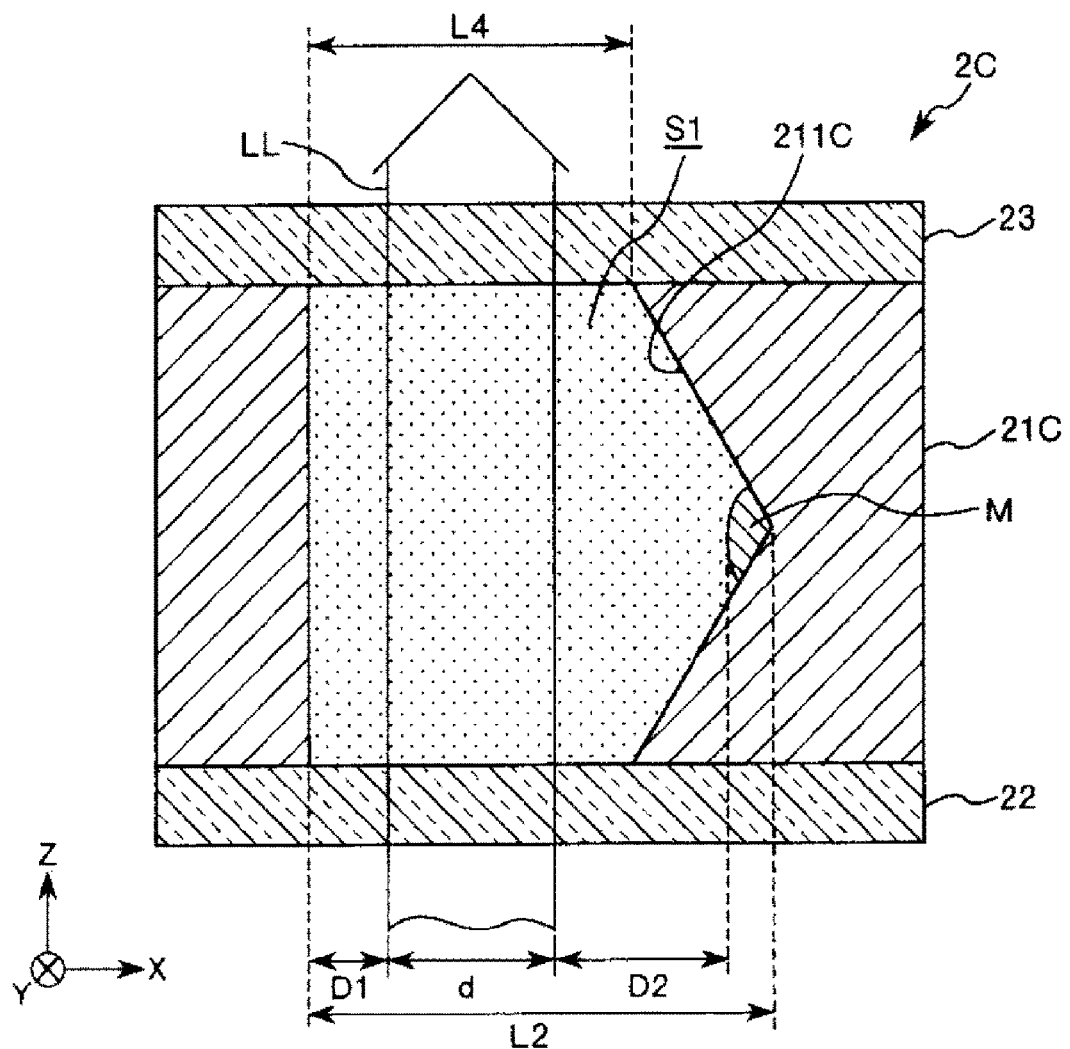
FIG. 10 is a longitudinal cross-sectional view illustrating a gas cell according to a fourth embodiment of the invention.

FIG. 10 is a longitudinal cross-sectional view of a gas cell according to the fourth embodiment of the invention.

The present embodiment is the same as the first embodiment except for a difference in a longitudinal cross-sectional shape of an inner space of the atomic cell.

In addition, in the following description, as to the fourth embodiment, differences from the above-described embodiments will be mainly described, and description of the same content will be omitted. Further, in FIG. 10, the same constituent elements as in the above-described embodiments are given the same reference numerals.

A gas cell 2C (atomic cell) of the present embodiment includes a body portion 21C instead of the body portion 21 of the first embodiment.

A columnar through hole 211C which penetrates through the body portion 21C in the Z axis direction is formed therein. The through hole 211C has a width in the X axis direction which is increased in the middle in the Z axis direction.

In other words, a length of the inner space S1 in the X axis direction is increased in the middle of the inner space S1 in the Z axis direction, and the middle part forms a "longitudinal portion". Thus, it is possible to easily dispose atoms of the liquid or solid alkali metal M at a desired local position (the middle part of the inner space S1 in the Z axis direction in FIG. 10).

Here, the middle part of the inner space S1 in the Z axis direction has L2 as a length in the X axis direction, and each of both end parts of the inner space S1 in the Z axis direction has L4 smaller than L2 as a length in the X axis direction. The length L4 is preferably the same as or larger than the length L1 from the viewpoint of securing a passing region of the excitation light LL.

Also in the above-described fourth embodiment, it is possible to minimize deterioration in characteristics due to the surplus alkali metal M.

Fifth Embodiment

Next, a fifth embodiment of the invention will be described.

Figure 11:
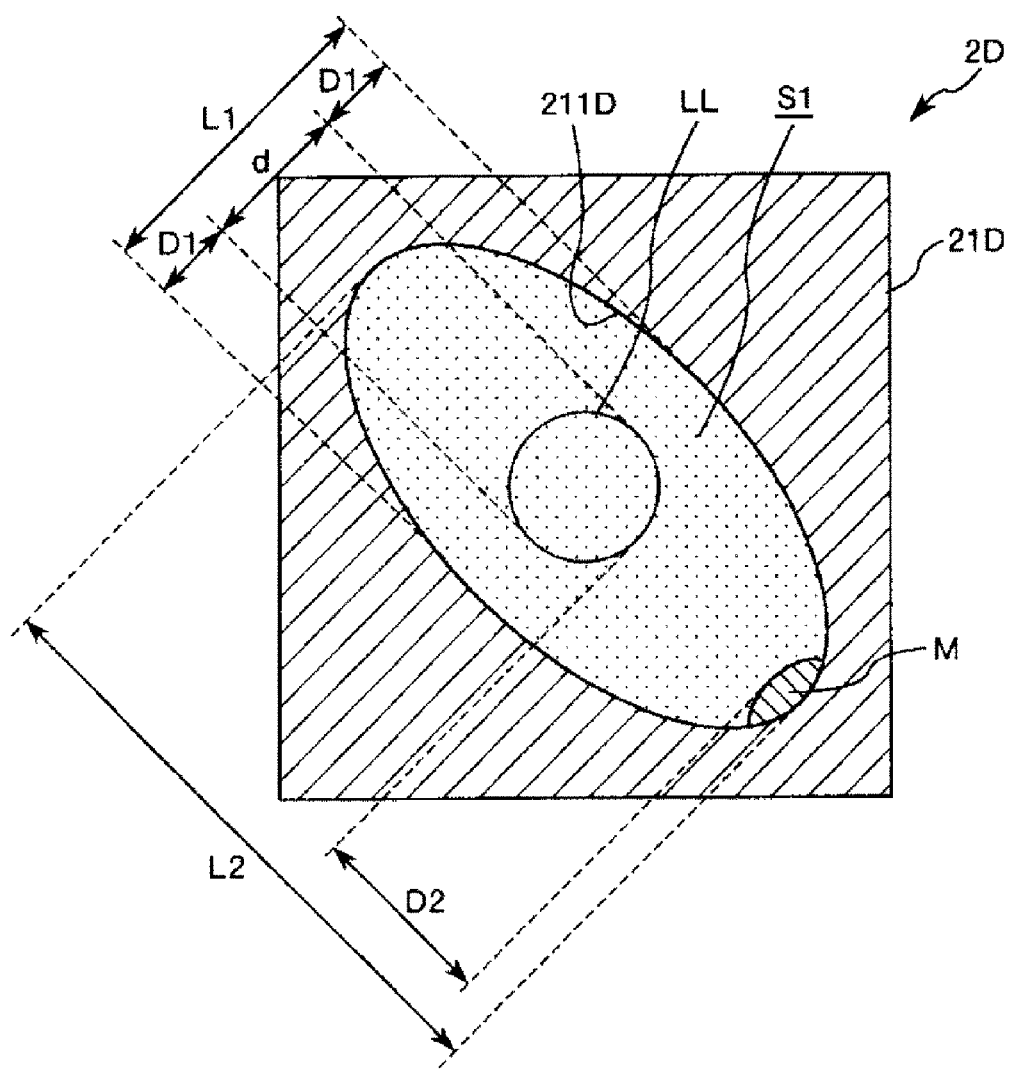
FIG. 11 is a transverse cross-sectional view illustrating a gas cell according to a fifth embodiment of the invention.

FIG. 11 is a transverse cross-sectional view of a gas cell according to the fifth embodiment of the invention.

The present embodiment is the same as the first embodiment except for a difference in a transverse cross-sectional shape of the atomic cell.

In addition, in the following description, as to the fifth embodiment, differences from the above-described embodiments will be mainly described, and description of the same content will be omitted. Further, in FIG. 11, the same constituent elements as in the above-described embodiments are given the same reference numerals.

A gas cell 2D (atomic cell) of the present embodiment includes a body portion 21D instead of the body portion 21 of the first embodiment.

A columnar through hole 211D which penetrates through the body portion 21D in the Z axis direction is formed therein. The through hole 211D has an elliptical shape or an oval shape when viewed from the Z axis direction.

In other words, a cross-sectional shape of the inner space S1 (longitudinal portion) in a direction perpendicular to the Z axis direction is an elliptical shape or an oval shape. Thus, it is possible to reduce a wasteful space of the inner space S1. As a result, it is possible to make the gas cell 2D small-sized.

Particularly, in the present embodiment, the inner space S1 in a longitudinal direction is disposed obliquely to exterior sides forming a quadrangle of the body portion 21D when viewed from the Z axis direction. In other words, when viewed from the Z axis direction, the elliptical or oval inner space S1 in the longitudinal direction is disposed along a diagonal line of the quadrangular body portion 21D. Thus, the inner space S1 is efficiently disposed in the body portion 21D so as to make the gas cell 2D small-sized.

Also in the above-described fifth embodiment, it is possible to minimize deterioration in characteristics due to the surplus alkali metal M.

2. Electronic Apparatus

The atomic oscillator as described above may be incorporated into various electronic apparatuses. These electronic apparatuses have high reliability.

Hereinafter, an electronic apparatus according to an embodiment of the invention will be described.

Figure 12:
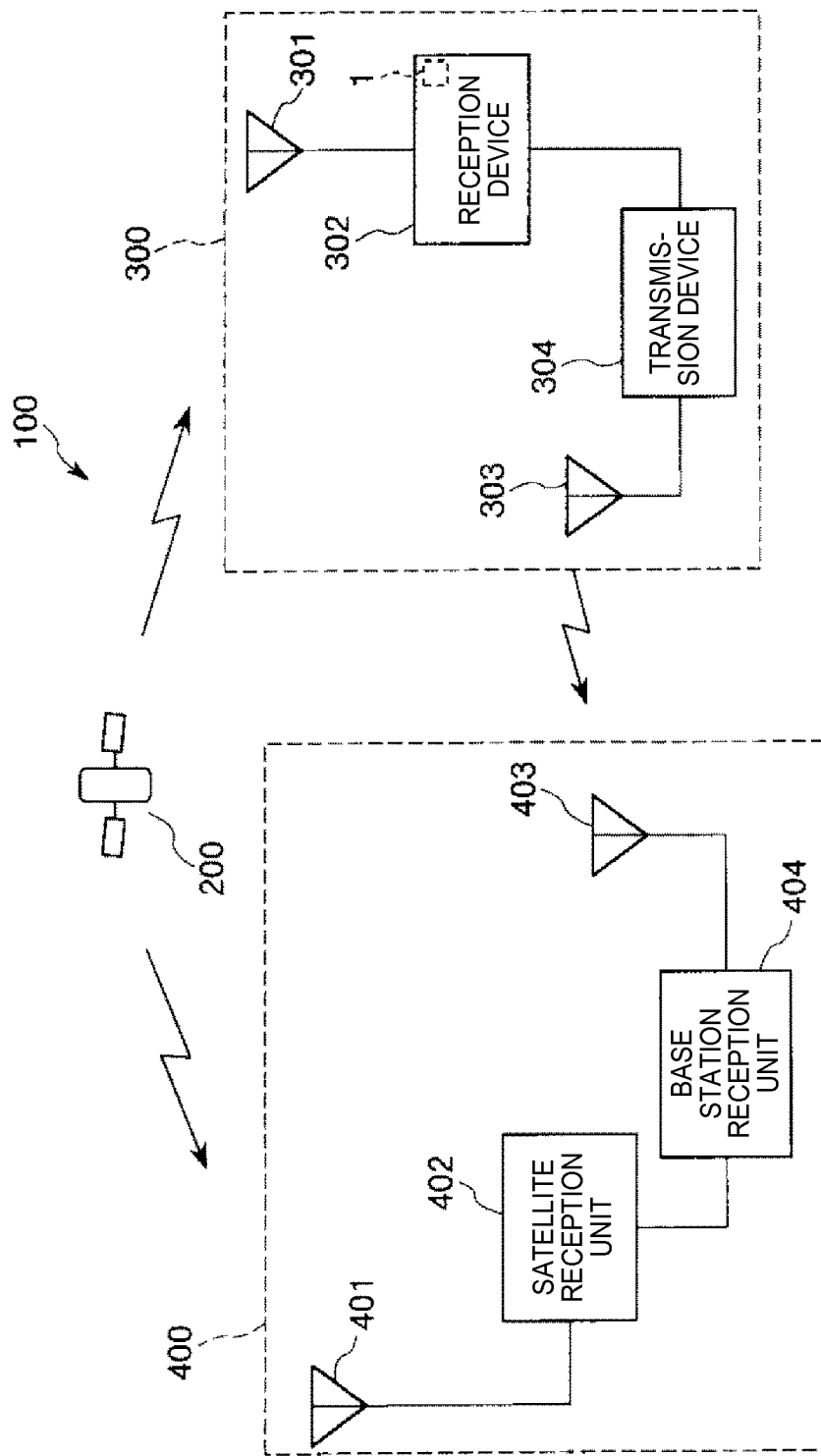
FIG. 12 is a diagram illustrating a schematic configuration in a case where the atomic oscillator according to the embodiments of the invention is applied to a positioning system using a GPS satellite.

FIG. 12 is a diagram illustrating a schematic configuration in a case where the atomic oscillator according to the embodiments of the invention is applied to a positioning system using a GPS satellite.

A positioning system 100 illustrated in FIG. 12 includes a GPS satellite 200, a base station apparatus 300, and a GPS reception apparatus 400.

The GPS satellite 200 transmits positioning information (GPS signal).

The base station apparatus 300 includes, for example, a reception device 302 which receives the positioning information with high accuracy from the GPS satellite 200 via an antenna 301 which is installed at an electronic reference point (GPS Observation Network of Geographical Survey Institute), and a transmission device 304 which transmits the positioning information received by the reception device 302 via an antenna 303.

Here, the reception device 302 is an electronic apparatus which includes the atomic oscillator 1 according to the embodiment of the invention as a reference frequency oscillation source. The reception device 302 has high reliability. In addition, the positioning information received by the reception device 302 is transmitted by the transmission device 304 in real time.

The GPS reception apparatus 400 includes a satellite reception unit 402 which receives the positioning information from the GPS satellite 200 via an antenna 401, and a base station reception unit 404 which receives the positioning information from the base station apparatus 300 via an antenna 403.

3. Moving Object

Figure 13:
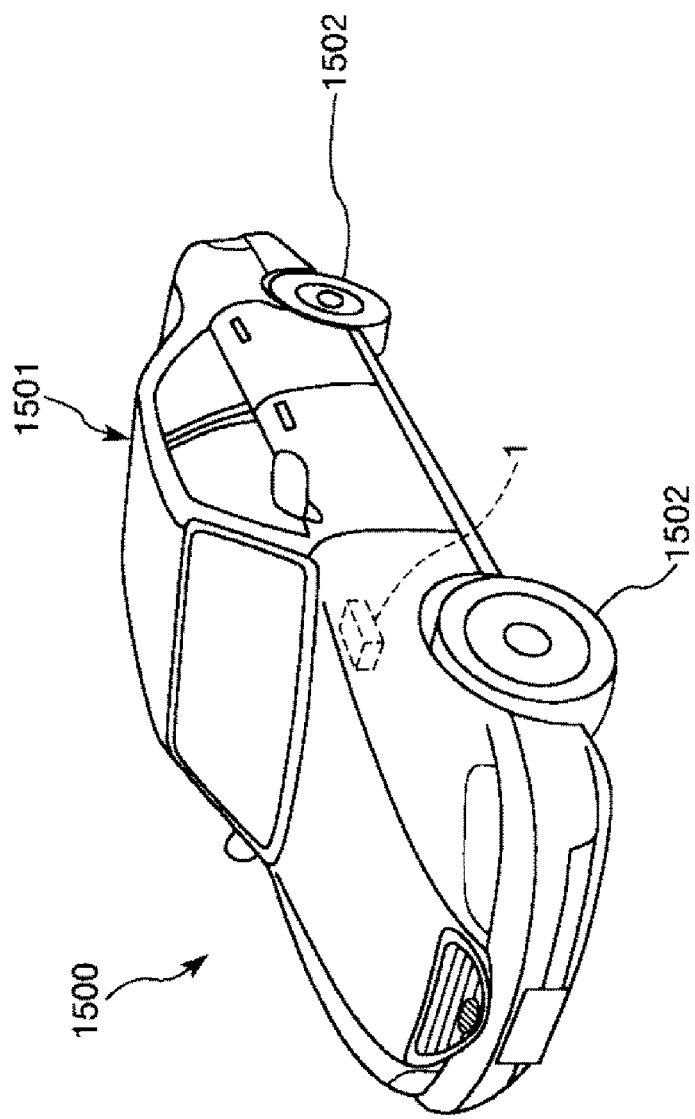
FIG. 13 is a diagram illustrating an example of a moving object according to an embodiment of the invention.

FIG. 13 is a diagram illustrating an example of a moving object according to an embodiment of the invention.

In FIG. 13, a moving object 1500 has a car body 1501 and four wheels 1502, and the wheels 1502 are rotated by a power source (engine) (not illustrated) provided in the car body 1501. The atomic oscillator 1 is built in the moving object 1500.

Such a moving object shows high reliability.

In addition, electronic apparatuses having the atomic oscillator according to the embodiment of the invention are not limited thereto, and may be applied to, for example, a mobile phone, a digital still camera, an ink jet type ejection apparatus (for example, an ink jet printer), a personal computer (a mobile type personal computer or a laptop type personal computer), a television, a video camera, a video tape recorder, a car navigation apparatus, a pager, an electronic organizer (including a communication function), an electronic dictionary, an electronic calculator, an electronic gaming machine, a wordprocessor, a workstation, a videophone, a security television monitor, an electronic binocular, a POS terminal, a medical apparatus (for example, an electronic thermometer, a sphygmomanometer, a blood glucose monitoring system, an electrocardiographic apparatus, an ultrasonic diagnostic apparatus, or an electronic endoscope), a fish-finder, various measurement apparatuses, meters and gauges (for example, meters and gauges of vehicles, aircrafts, and ships), a flight simulator, a terrestrial digital broadcast, and a mobile phone base station.

As mentioned above, the atomic cell, the atomic resonance transition device, the atomic oscillator, the electronic apparatus, and the moving object according to the embodiments of the invention have been described with reference to the drawings, but the invention is not limited thereto.

In addition, a configuration of each unit according to the embodiments of the invention may be replaced with any configuration showing the same function as in the above-described embodiments, and any configuration may be added thereto.

Further, the invention may cover a combination of arbitrary configurations of the respective embodiments.

Further, in the embodiments of the invention, the quantum interference device which brings cesium or the like into resonance transition by using a quantum interference effect which is caused by two kinds of light beams with different wavelengths has been described as an example of the atomic resonance transition device, but the invention is not limited thereto, and may be applied to a double resonance device which brings rubidium or the like into resonance transition by using a double resonance phenomenon caused by light and microwaves.

The entire disclosure of Japanese Patent Application No. 2013-200579 filed Sep. 26, 2013 is expressly incorporated by reference herein.

What is claimed is:

1. An atomic resonance transition device comprising:
an atomic cell including:
a pair of windows;
a body disposed between the pair of windows and forming an inner space with the pair of windows; and
metal atoms sealed within the inner space,
wherein the inner space has lengths L1 and L2 in directions perpendicular to each other in a cross-section of the inner space intersecting a direction in which the pair of windows are arranged, and $L2/L1 \geq 1.1$, wherein a longitudinal portion of the inner space having the cross-section extends in the direction in which the pair of windows are arranged; and a light emitting unit that emits light including a pair of resonance light beams for resonating the metal atoms toward the atomic cell, wherein the atomic cell is configured to pass the light from the light emitting unit directly through the inner space without reflecting the light again through the inner space, wherein the longitudinal portion includes a metal reservoir at which liquid or solid metal atoms are disposed at one end in a longitudinal direction, and wherein a distance between an inner wall surface of the body and the light is D1, and a distance between the liquid or solid metal atoms disposed at the metal reservoir and the light is D2, and $2 \times D1 \leq D2$.

2. The atomic cell according to claim 1, wherein L2 is constant over an entirety of the inner space in the direction in which the pair of windows are arranged.

3. The atomic cell according to claim 1, wherein L2 is measured at an end or in a middle of the inner space in the direction in which the pair of windows are arranged.

4. The atomic cell according to claim 1, wherein the cross-section of the inner space is elliptical.

5. The atomic cell according to claim 1, wherein L1 is in a range of $0.5\ mm \leq L1 \leq 3\ mm$.

6. The atomic resonance transition device according to claim 1, wherein a center of the longitudinal portion and a center of the light are deviated relative to each other in the longitudinal direction when viewed from the direction in which the pair of windows are arranged.

7. The atomic resonance transition device according to claim 1, wherein the D1 is in a range of $0.05\ mm \leq D1 \leq 1\ mm$.

8. An atomic oscillator comprising the atomic resonance transition device according to claim 1.

9. An electronic apparatus comprising the atomic resonance transition device according to claim 1.

10. A moving object comprising the atomic resonance transition device according to claim 1.

11. An atomic resonance transition device comprising:

an atomic cell that includes an inner space in which metal atoms are sealed; and a light emitting unit that emits light including a pair of resonance light beams for resonating the metal atoms toward the atomic cell in a first direction, wherein the atomic cell is configured to pass the light from the light emitting unit directly through the inner space without reflecting the light again through the inner space, wherein the inner space includes a metal reservoir at which liquid or solid metal atoms are disposed, the metal reservoir being at part of a wall surface of the inner space, and the wall surface extends along the first direction, and wherein a distance between the wall surface of the inner space and the light is D1, and a distance between the liquid or solid metal atoms disposed at the metal reservoir and the light is D2, and $2 \times D1 \leq D2$.

12. The atomic cell according to claim 11, wherein a longitudinal portion of the inner space having a cross-section extends in as direction in which a pair of windows, which are provided at both sides of the atomic cell, are arranged.

13. The atomic cell according to claim 11, wherein
a cross-section of the inner space is elliptical.

* * * * *